United States Patent
Glogovsky

Patent Number: 6,107,110
Date of Patent: Aug. 22, 2000

[54] METHOD AND APPARATUS FOR AIMING A SPRAY ETCHER NOZZLE

[75] Inventor: Kenneth Gerard Glogovsky, Kempton, Pa.

[73] Assignee: Lucent Technologies Inc., Murray Hill, N.J.

[21] Appl. No.: 09/366,250

[22] Filed: Aug. 3, 1999

Related U.S. Application Data

[62] Division of application No. 09/074,668, May 8, 1998, Pat. No. 5,993,681.

[51] Int. Cl.$^7$ .................................................. H01L 21/66
[52] U.S. Cl. ............................................ 438/16; 438/689
[58] Field of Search ........................... 438/689, 16, 712; 134/122; 156/345, 625; 216/84, 85, 44, 66; 356/138

[56] References Cited

U.S. PATENT DOCUMENTS

| | | | |
|---|---|---|---|
| 4,444,495 | 4/1984 | Bramwell et al. | 356/138 |
| 5,387,313 | 2/1995 | Thoms | 156/626 |
| 5,618,446 | 4/1997 | Nagaishi | 216/65 |
| 5,972,234 | 10/1999 | Weng et al. | 216/44 |

FOREIGN PATENT DOCUMENTS 2159939  12/1985  United Kingdom .

*Primary Examiner*—Mary Wilczewski
*Assistant Examiner*—C. Lee
*Attorney, Agent, or Firm*—Wendy W. Koba

[57] ABSTRACT

A method and apparatus for achieving alignment between a spray etcher nozzle and a semiconductor (either microelectronic or optoelectronic, for example) wafer surface. A spray nozzle tip is temporarily removed from the spray nozzle and an illumination source, such as a low power laser, is activated and inserted in its place. The laser emission illuminates the wafer surface and, by adjusting the position of the nozzle, alignment between the nozzle and wafer can be achieved. Once aligned, the nozzle is locked in place and the laser is replaced with the conventional spray nozzle tip.

3 Claims, 1 Drawing Sheet

METHOD AND APPARATUS FOR AIMING A SPRAY ETCHER NOZZLE

This is a divisional of application Ser. No. 09/074,668, filed on May 8, 1998, now U.S. Pat. No. 5,993,681.

BACKGROUND OF THE INVENTION

The present invention relates to method and apparatus for aiming a spray etcher nozzle and, more particularly, to using a source of illumination at the spray nozzle tip to illuminate the wafer surface so as to assist in properly aiming the nozzle with respect to the wafer.

In the fabrication of semiconductor devices, for example, microelectronic or optoelectronic devices, there may be certain processes that require the use of a etch material sprayed on the surface of a wafer containing the optoelectronic devices. For example, GaAs or InP wafers are often etched, one at a time, in a spray chamber. The wafer may be etched in, for example, a dilute acidic or basic solution, rinsed on both sides, then transported out of the spray chamber. The etchant solution is delivered to the chamber via suitable tubing (e.g., Teflon) from an external source. The solution exits a nozzle located in a ball mount, where the mount is fully adjustable to allow for positioning of the spray nozzle tip by the user.

Although the use of the fully adjustable nozzle tip permits a great deal of freedom in setting up the tool, the "aim" of the nozzle with respect to the wafer has been found to affect the intra-wafer etch uniformity. That is, various optoelectronic devices on the same wafer may exhibit different etch geometries. In current systems, the position of the spray with respect to the wafer surface is usually "eyeballed" by the machine operator and, therefore, may often be not positioned in the optimum location required to provide uniform results.

Thus, a need remains in the art for a means of adjusting the aim of spray etcher nozzles.

SUMMARY OF THE INVENTION

The need remaining in the art is addressed by the present invention, which relates to method and apparatus for aiming a spray etcher nozzle and, more particularly, to using a source of illumination at the spray nozzle tip to illuminate the wafer surface to be etched and provide an alignment target for the machine operator.

In an exemplary embodiment of the present invention, a conventional spray tip is temporarily removed from the nozzle and replaced with an illumination source, such as a low power laser. An alignment target is placed in the chamber and illuminated by the laser. The nozzle is then maneuvered until the target is illuminated in a predetermined manner that is consistent with the proper alignment of the nozzle tip to the wafer surface. The nozzle tip is then "locked" in place and the illumination source is removed. The conventional spray tip is re-inserted in the nozzle and the target is removed from the chamber. The optoelectronic wafers may then be processed through the spray etcher in a conventional manner, with the assurance that the nozzle tip is properly aligned.

An exemplary spray etcher may include one or more spray nozzles. The nozzle positioning technique of the present invention may be used in a repeated fashion to provide for proper alignment of each separate nozzle with respect to the wafer surface.

Other and further advantages of the present invention will become apparent during the course of the following discussion and by reference to the accompanying drawings.

BRIEF DESCRIPTION OF THE DRAWINGS

Referring w to the drawings.

DETAILED DESCRIPTION

Figure 1:
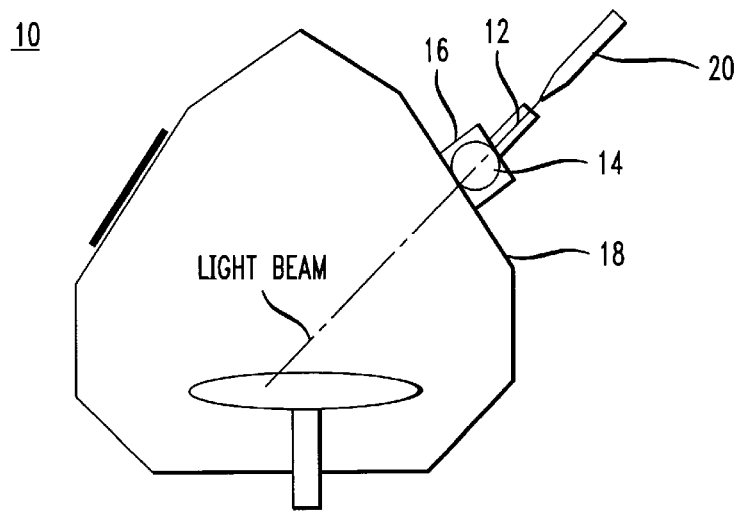
FIG. 1 is an exploded view of an exemplary spray nozzle tip and low power laser source inserted in the end thereof.
Figure 2:
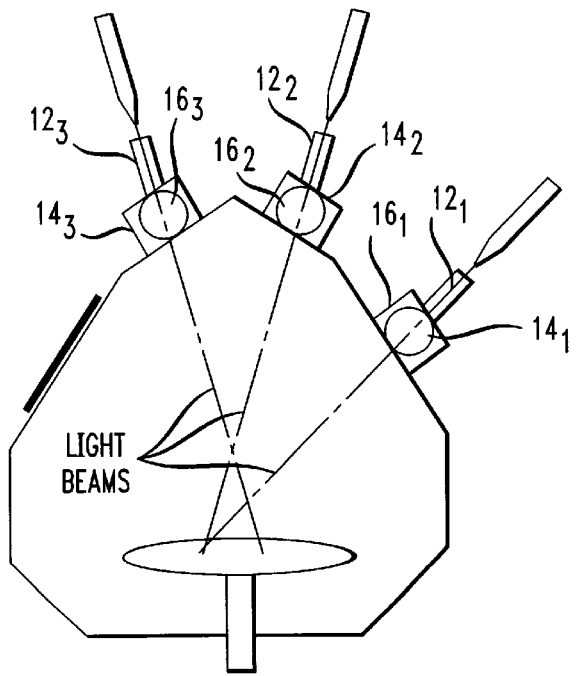
FIG. 2 illustrates an exemplary spray etcher including three separate nozzles.

An exploded view of an exemplary spray etch nozzle system 10 is illustrated in FIG. 1. A nozzle clamp component 12 is positioned within a ball mount 14. As noted above, ball mount 14 is fully adjustable within a bracket 16. Bracket 16 is attached to the outer surface 18 of an exemplary spray etch chamber. FIG. 2 is an illustration of a conventional spray etch chamber including a set of three spray nozzles, each identified with a separate subscript, but utilizing the same numbering convention as shown in FIG. 1.

Figure 3:
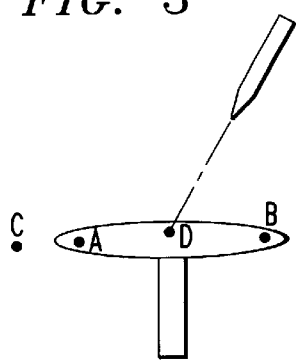
FIG. 3 illustrates the relationship between the spray nozzle tip of FIG. 1 and an illuminated target within a spray etcher chamber.

In accordance with the present invention, the spray tip is temporarily replaced with a self-contained illumination source, such as a low power laser 20 or any other suitable focused beam. The illumination source is activated before insertion in nozzle clamp 12 so that the light output from source 20 can illuminate a target wafer positioned within the chamber. FIG. 3 illustrates the relationship between nozzle system 10 and an exemplary target 22. In order to achieve proper alignment between nozzle system 10 and target 22, the nozzle is adjusted and the illumination pattern on the target is observed. The illumination pattern is represented in FIG. 3 by a set of points A, B, C and D. Points A, B and C are all indicative of misalignment of nozzle system 10 with target 22.

Once alignment has been achieved (represented by point D), nozzle system 10 is locked in place so that ball mount 14 will remain motionless. Light source 20 is then removed and a conventional spray nozzle tip (not shown) is inserted into the clamp 12 of spray nozzle tip 10. Since ball mount 14 has been locked, there will be no further motion of the nozzle tip and alignment between nozzle system 10 and to-be-processed wafers will be ensured.

For systems using more than one etchant source, such as the three spray chamber of FIG. 2, the alignment process described above may be repeated for each source. Alternatively, three different light sources may be inserted in the spray nozzle tips such that all nozzles may be aligned at the same time. Also, the alignment process will need to be repeated when different size wafers (for example, 3 inch, or 5 inch, or even 6 inch) are to be spray etched.

It is to be understood that the above description is exemplary only, and the teachings of the present invention are only limited by the scope of the claims appended hereto.

What is claimed is:

1. A method of aligning a spray etcher nozzle with an exposed surface of a semiconductor wafer, the method comprising the steps of:

a) removing a nozzle tip from a spray etcher nozzle;

b) inserting an illumination source in the nozzle tip, the illumination source having been activated;

c) adjusting the position of the nozzle with respect to a target wafer by viewing the illumination on the wafer surface until proper alignment is achieved;

d) locking the nozzle position when alignment is achieved; and e) removing the illumination source and replacing with an etchant source.

2. The method as defined in claim 1 wherein in performing step b), a low power laser source is used.

3. The method as defined in claim 1 for use with a multiple nozzle system wherein steps a)–e) are repeated for each nozzle in the nozzle system.

* * * * *